United States Patent [19]
Schiff

[11] 4,403,255
[45] Sep. 6, 1983

[54] FM/TV AUTOMATIC GAIN CONTROL SYSTEM

[75] Inventor: Leonard N. Schiff, Lawrenceville, N.J.

[73] Assignee: RCA Corporation, New York, N.Y.

[21] Appl. No.: 324,584

[22] Filed: Nov. 24, 1981

[51] Int. Cl.³ .............................................. H04N 5/38
[52] U.S. Cl. ..................... 358/186; 455/43; 455/116
[58] Field of Search ................. 358/186; 455/43, 72, 455/110, 116

[56] References Cited

U.S. PATENT DOCUMENTS

| 3,477,042 | 11/1969 | Wachs | 332/16 |
| 3,500,206 | 3/1970 | Kaneko et al. | 325/46 |
| 3,529,244 | 9/1970 | Torick et al. | 325/147 |
| 3,648,178 | 3/1972 | Hershberg | 325/145 |
| 3,651,429 | 3/1972 | Ruthroff | 332/18 |
| 3,808,540 | 4/1974 | Kabrick | 325/187 |
| 4,092,674 | 5/1978 | Rhodes | 358/186 |

*Primary Examiner*—Michael A. Masinick
*Attorney, Agent, or Firm*—J. S. Tripoli; D. W. Phillion

[57] ABSTRACT

An improved automatic gain control (AGC) for a television transmission system comprising a transmitter for transmitting a TV signal via a transmission path to a receiver and having a certain bandwidth in which said transmitter includes a generator for generating a baseband TV signal which can be pre-emphasized, and a variable gain amplifier responsive to the baseband TV signal to produce an amplified baseband video signal. The AGC system comprises a band eliminating filter responsive to the baseband output signal to produce a control signal whose amplitude reflects the change in energy content of that portion of the TV output signal lying outside the allowed transmission bandwidth. The variable gain amplifier is responsive to the control signal to vary its gain substantially inversely as the out-of-band energy content varies. At the receiver a detector detects a component of the received TV signal which has known characteristics, usually constant, in the absence of the gain introduced at the transmitter. The detector produces a control signal which controls an amplifier to compensate for such gain and return the TV signal to its original form.

10 Claims, 12 Drawing Figures

AT TRANSMITTER

AT TRANSMITTER

FM/TV AUTOMATIC GAIN CONTROL SYSTEM

This invention relates generally to the use of automatic gain control (AGC) circuits for frequency modulated television (FM/TV) signals and more particularly to an improved AGC circuit for FM/TV transmission.

In the prior art, AGC is effected in FM/TV systems by supplying a baseband TV signal to a pre-emphasis circuit, the output of which is supplied to a variable gain amplifier before going to the FM modulator. The gain variation of the variable gain amplifier is usually set by a control loop consisting of an amplitude detector and a low pass filter wherein the amplitude detector detects the energy of the output signal of the pre-emphasized video signal and, for large values of amplitude, lowers the gain of the amplifier, and, for small values of amplitude, increases the gain of the amplifier.

The amplitude detector output must be filtered by a low pass filter so that the gain changes are not made too quickly. However, on the other hand, the low pass filter must have sufficient bandwidth so that the gain of the amplifier can vary fast enough. More specifically, the bandwidth of the low pass filter must be large compared with the reciprocal line time, i.e., the time of one TV line, so that multiple gain changes can occur during the course of any single TV line (the reason being that the signal varies considerably over this period of time). On the other hand, the bandwidth must be small compared to the bandwidth of the TV picture, e.g., 4.2 MHz, since it is not desirable that the gain of the amplifier change in response to the instantaneous value of the video picture but rather to its amplitude averaged over a suitable length of time.

While such an AGC system is quite adequate for a baseband signal which consists of, for example, frequency division multiplex voice conversation having very few sudden large bursts of energy, it is not suitable for FM/TV transmission. The operation that occurs with an AGC system in FM/TV can be explained as follows. The signal-to-noise (S/N) ratio of an FM/TV transmission is dependent on the deviation of the FM modulator, i.e., the higher the deviation of the FM modulator, the larger the S/N ratio. Most of the time the TV baseband signal is relatively low in root mean square value. Thus, to provide large S/N ratios, the gain of the amplifier which drives the FM modulator should be large. However, if that gain is fixed, on those occasions when the signal supplied to the amplifier is very large and/or rapidly changing, problems can arise. For example, the TV signal will become very large when the luminance value of the picture varies suddenly from a brilliant white to a dark black and when the chrominance subcarrier is of high amplitude. The deviation of the FM modulator caused by such signals is one determinant of the bandwidth required by the resulting RF signal. If the gain of the amplifier is set too high, distortion will result because the RF spectrum of the resulting TV signal from the FM modulator is wider than the bandwidth of the collective filters of a transmission medium such as a satellite. The collective filter is defined as the product of the transmission characteristics of each of the filters in the transmission path (in a satellite for example) when brought to a common center frequency. One use of this invention is in satellite transmission which employ band select filters and which are an important factor in determining the filter characteristics of the overall transmission path.

Accordingly, what is employed in the prior art is an amplifier whose gain increases when the TV waveform is low in amplitude and frequency content and tending to produce narrow frequency spectra. The high gain of the amplifier tends to spread out the frequency spectrum. On the other hand, when the picture content is such as to widen the spectrum, the gain of the amplifier contracts to keep the frequency spectrum within the frequency bounds of the filters in the transmission path.

One difficulty with the prior art AGC systems is that the RF spectrum of the FM modulator depends not only upon the amplitude of the TV signal but also upon its frequency content. Worded differently, the bandwidth of the signal generated by the FM modulator is set by both the frequency content and the amplitude. This is not a disadvantage in frequency division multiplex voice signal processing, as mentioned above, since the frequency content of the baseband tends to remain constant. However, in FM/TV transmission, the baseband video waveform has a frequency content which varies over much larger ranges than voice signal processing. For example, when the TV picture being transmitted is highly saturated, the chrominance subcarrier amplitude becomes very high causing the frequency content to be skewed to the high end of the frequency spectrum, whereas when the picture is black-and-white or pale pastel in color, the chrominance amplitude is low and the frequency content tends to be shifted to the lower values. What is needed therefore, is an AGC circuit where the gain of the amplifier is determined not only by the amplitude of the TV signal but also by its frequency content.

The present invention accomplishes the foregoing by structure which directly measures the out-of-band energy content that would normally be produced by the FM modulator and processes such out-of-band energy content to form a control signal which controls the gain of the variable gain amplitude and thus the swing of the FM modulator.

In accordance with a preferred embodiment of the invention there is provided an improved AGC system for a frequency modulated television (FM/TV) transmission system of the type comprising a transmitter for transmitting an FM/TV signal to a receiver over a transmission path having a certain bandwidth and in which said transmitter comprises a signal generator for generating a TV signal, a variable gain amplifier responsive to the TV signal to produce an amplified TV signal and a frequency modulator for producing an FM/TV signal. The improved AGC system comprises a control circuit responsive to the TV signal for producing a control signal whose amplitude reflects the energy content of that portion of the FM/TV signal lying outside the transmission bandwidth. The variable gain amplifier is responsive to the control signal to vary its gain substantially inversely as the energy content varies. A detector is provided at the receiver to detect variations in a component of the received video signal having known characteristics, in the absence of the changes in gain at the transmitter, to produce a second output signal reflecting such gain changes at the transmitter. An amplifier at the receiver is responsive to such second output signal to vary its gain in a manner complementary to the changes in gain of the variable gain amplifier at the transmitter and thereby correct for the changes in gain introduced into the signal actually transmitted to more closely reproduce the original video signal.

Figure 1:
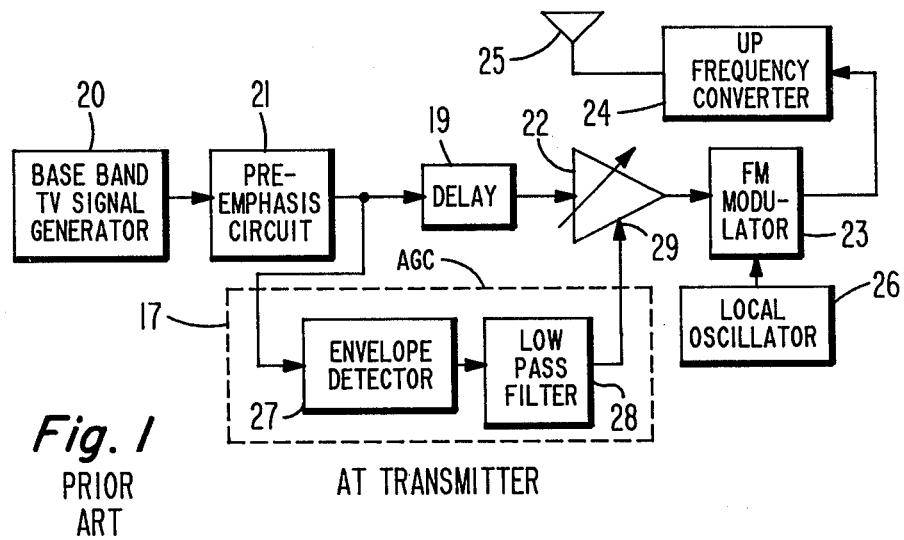
FIG. 1 is a block diagram of an FM/TV transmitter employing a prior art AGC system.

Referring now to FIG. 1, there is shown a prior art FM/TV transmitter in which a baseband composite TV signal is produced in source 20 and supplied to pre-emphasis circuit 21, the output of which is supplied directly to variable gain amplifier 22 through delay means 19 and through a prior art AGC circuit 17. The source might, for example, be the output from a video tape recorder with appropriate composite video and sync signals. The output of amplifier 22 is supplied to FM modulator 23 which modulates the carrier signal from local oscillator 26 with the received TV signal from source 20 and supplies the output to up-frequency converter 24 which produces the final RF carrier frequency signal. The RF output of up-frequency converter 24 is supplied to antenna 25 from whence it is radiated to a receiver via some selected transmission media such as a satellite which includes filters having selected passband or transmission path bandwidths.

The AGC loop 17, which consists of envelope detector 27 and low pass filter 28, responds to the entire signal supplied from pre-emphasis circuit 21. The entire signal includes that portion of the signal which, after FM modulation, lies within the transmission path bandwidth and that portion which, after FM modulation, lies outside. In the event of a large signal being supplied to pre-emphasis circuit 21, the AGC circuit 17 cannot distinguish which portion of the signal produced by the FM modulator, in response thereto, will lie outside the transmission path bandwidth and which will lie inside, and therefore tends to reduce the gain of amplifier 22 to a point where the signal within the bandwidth is unnecessarily attenuated, resulting in a poor signal-to-noise ratio distortion at the receiver. On the other hand, if the signal received from pre-emphasis circuit 21 has a low amplitude then the AGC circuit will respond thereto to increase the gain of amplifier 22 to the point where the out-of-band energy content may be excessively high, resulting in distortion at the receiver. This distortion will be accentuated if the low amplitude signal is in the high frequency portion of the baseband. The delay means 19 permits the signal passing through the AGC circuit 17 to arrive at the control input 29 of amplifier 22 at the same time as the signal from delay means 19 arrives at the input of amplifier 22.

Figure 2:
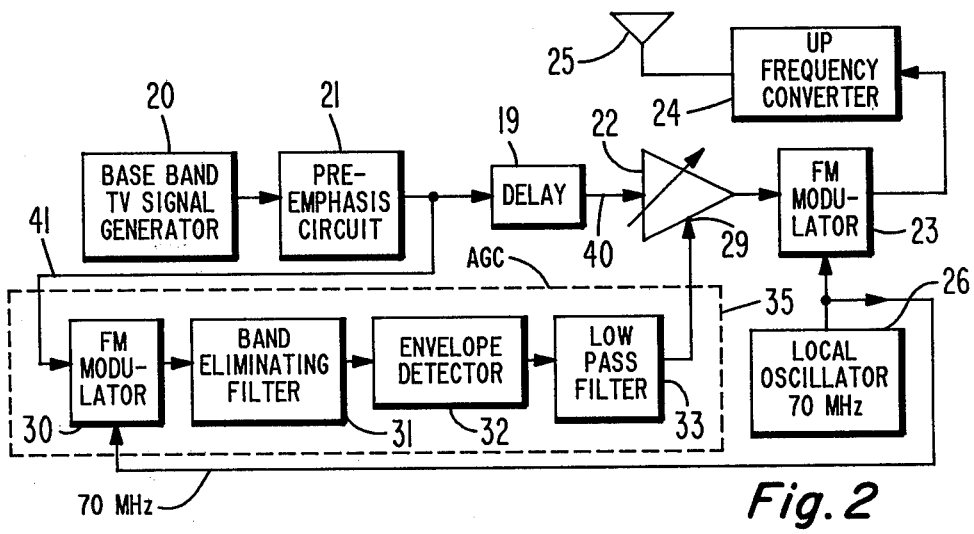
FIG. 2 is a block diagram of an FM/TV transmitter according to one embodiment of the invention.

Referring now to FIG. 2, there is shown an FM/TV transmitter according to a preferred embodiment of the invention. The basic elements of the system include baseband TV signal generator 20, pre-emphasis circuit 21, delay 19, lead 40, variable gain amplifier 22, FM modulator 23, local oscillator 26, up-frequency converter 24, and antenna 25, all of which correspond to elements in FIG. 1 and are identified by the same reference characters.

However, in FIG. 2, the AGC logic within dotted block 35 is quite different than that within dotted block 17 of the prior art of FIG. 1 and constitutes one form of the present invention. Within the AGC 35 an FM modulator 30 receives the output of pre-emphasis circuit 21 and local oscillator 26, which can be tuned to 70 MHz, and functions to simulate the action of FM modulator 23 in the absence of AGC. The output signal of FM modulator 30 will therefore have the same characteristics and frequency spectrum as will the output of FM modulator 23.

Figure 2A:
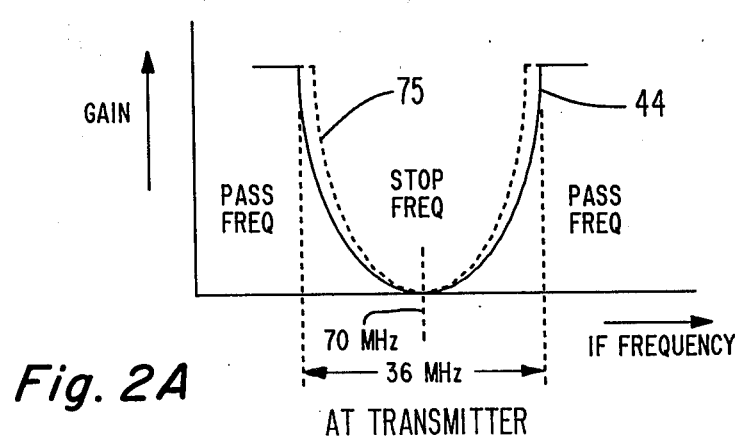
FIG. 2A shows curves of the bandpass characteristics of a filter employed in the structure of FIG. 2.

Band eliminating filter 31 receives the IF frequency output signal from FM modulator 30 and is designed to filter out all of that portion of such output signal which lies within the transmission path bandwidth defined hereinbefore and as indicated by the curve 44 of FIG. 2A. The area within the curve 44 identified by the legend "STOP FREQUENCY" represents that portion of the output signal of FM modulator removed by band eliminating filter 31. The center frequency of the "STOP FREQUENCY" band can be 70 MHz, determined by the 70 MHz output of local oscillator 26. The bandwidth typically can be 36 MHz for one form of satellite transmission. The portions of the frequency response curve of FIG. 2A marked "PASS FREQUENCY" indicate that portion of the video signal which lies outside the transmission path bandwidth. Such out-of-band signal is supplied to energy detector 32 which responds thereto to form an envelope defining the amount of energy lying outside the transmission path bandwidth.

The criteria for designing a band eliminating or stop band filter of a type suitable for use in block 31 of FIG. 2 is discussed on pages 148–155 of a publication by J. K. Skwirzynski, entitled "Design Theory and Data For Electrical Filters," published by D Van Nostrand Company of London, copyrighted in 1965, catalogued in the Library of Congress on Card No. 65-11072, and incorporated herein by reference.

The low pass filter 33 processes the output of energy detector 32 to provide the proper time constant for the control signal supplied therefrom to amplifier 22 so that amplifier 22 does not respond to instantaneous changes in the picture but yet can accommodate changes occurring in a single horizontal line of the TV signal.

Figure 3:
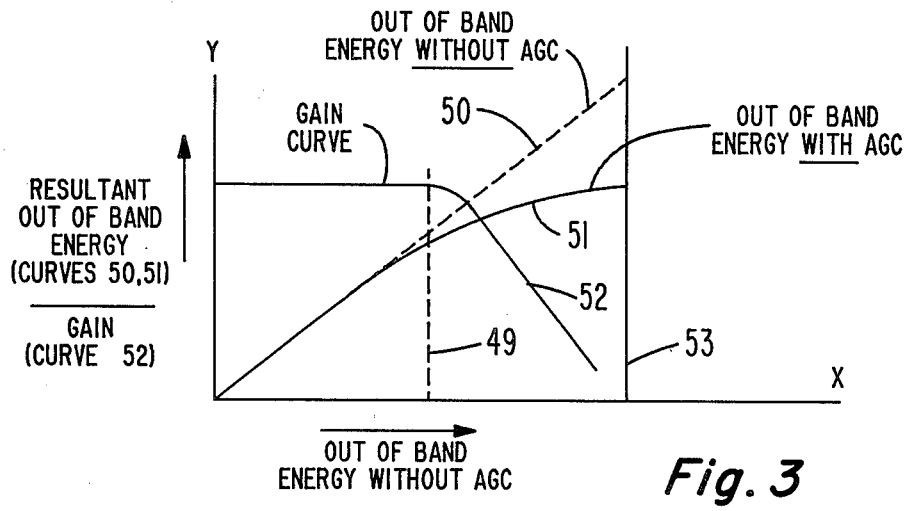
FIG. 3 is a set of curves illustrating the general principles of the invention.

Thus, in summary, the AGC circuit 35 of FIG. 2 controls the gain of amplifier 22 with only that portion of the energy content of the video signal which, when frequency modulated and up-converted, lies outside the bandwidth of the transmission path and in this manner controls the amount of said out-of-band energy to some predetermined value. The curves of FIG. 3 illustrate the foregoing in more detail.

The horizontal (X) axis represents the finally transmitted out-of-band spectral energy that would result without any AGC action whatsoever. The vertical (Y) axis has two sets of values. Firstly, the vertical axis indicates the gain (curve 52) of AGC amplifier 22 of FIG. 2 and secondly the vertical axis indicates the resultant out-of-band spectral energy with an AGC circuit, both of constant gain as used in FIG. 1 (curve 50) and of variable gain as used in FIG. 2 (curve 51). More specifically, the dashed 45 degree line 50 in FIG. 3 shows the resultant out-of-band spectral energy (along the Y axis) that would result if amplifier 22 had constant gain. Such resultant out-of-band spectral energy (as measured along the Y axis) would then be equal to the out-of-band spectral energy without the AGC (as measured along the X axis and generated at the output of AGC circuit 35). However, once the out-of-band spectral energy, as measured in the AGC control path 35 of FIG. 2 (which is without AGC), starts to exceed a given value, as at the vertical line 49 of FIG. 3, the gain of variable gain amplifier 22, as represented by curve 52 of FIG. 3, starts to be reduced producing the resulting out-of-band spectral energy represented by curve 51. Such out-of-band energy (curve 51) can be seen to be less than the out-of-band energy curve 50 which would occur without the AGC control circuit 35.

Hence, the control path 35 which senses the amount of out-of-band energy without the AGC (within the control path) can be used to control the gain in the signal path and thus reduce the resultant out-of-band energy.

Thus, in effect, the control path 35 of FIG. 2 senses those cases where distortion would be produced because the out-of-band spectral energy would be excessively high if the gain of amplifier 22 were not reduced and accordingly lowers the gain of amplifier 22 with the result that the actual out-of-band energy produced at the output of FM modulator 23 is reduced with a resulting reduction in signal distortion.

Figure 4:
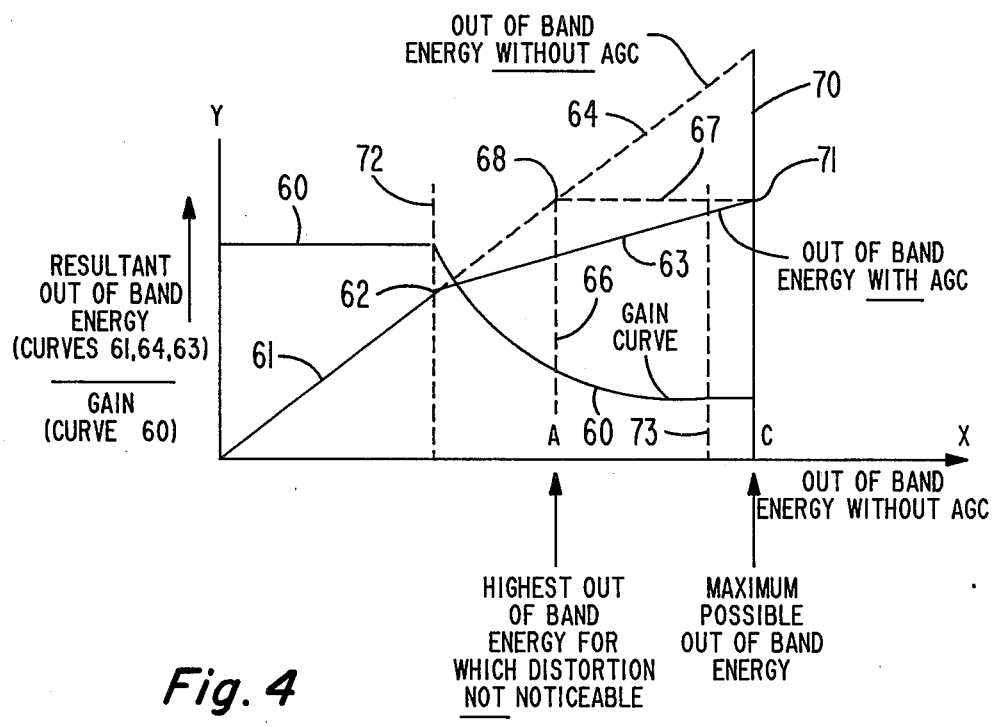
FIG. 4 is another set of curves showing in more detail some of the design considerations required in constructing the invention of FIG. 2.

The curve of FIG. 4 illustrates how the foregoing can be employed in the design process. The X axis of FIG. 4 again represents the out-of-band energy without AGC as produced by AGC control circuit 35 and the 45 degree dashed line 64 shows what the resulting out-of-band spectral energy (as measured along the Y axis) would be if the signal path had constant gain (i.e., without the AGC control circuit 35). Let the intersection point 68 of the vertical dotted line 66 with the 45 degree dashed line 64 represent the point where the resultant out-of-band energy becomes a problem in that it introduces unacceptable distortion into the picture. Line 67 extends from point 68 in the X axis direction until it intersects vertical line 70 in the Y axis direction at point 71 which represents the maximum out-of-band spectral energy of any FM/TV waveform that could be transmitted.

Thus, the desired out-of-band energy curve 61–63, expressed as a function of out-of-band spectral energy without AGC, is shown as a two segment linear curve, the first segment 61 rising at a 45° slope and the second segment 63 extending at a shallower slope to the maximum value 71 discussed above. To obtain the curve 61–63 requires a gain curve 60 which is a function of the out-of-band spectral energy measured in the control path 35 of FIG. 2 along the x axis. More specifically, the shape of gain curve 60 will produce the out-of-band energy waveform 61–63 and the shape of gain curve 60 is determined by the AGC loop 35 of FIG. 2.

In a circuit having the characteristics shown in FIG. 4 a color bar pattern, for example, existing along the dotted line 73 will experience relatively low gain, thereby preventing distortion through this type of waveform. On the other hand, for a more typical video picture which normally lies on the x axis to the left of vertical line 66, the gain is considerably higher, resulting in more deviation of the FM modulator 23 of FIG. 2 and hence a better signal-to-noise (S/N) ratio.

In summary, the control circuit 35 of FIG. 2 measures the distortion that would be produced if the AGC amplifier gain were held constant. The control path 35 does this by measuring the spectral energy that would be produced outside the transmission path bandwidth in the absence of AGC control. As such out-of-band spectral energy grows, it lowers the amplifier gain in proportion.

Because this out-of-band energy can be a small value it might be convenient to use a band eliminating filter in the control path that actually has a slightly lower bandwidth than the bandwidth of the transmission path. The foregoing has the effect of amplifying the amount of energy measured by the envelope detection circuit 32 in FIG. 2, and, in a sense, anticipating values of energy before they actually produce distortion. The foregoing bandpass characteristics of band eliminating filter 31 of FIG. 2 would then have a shape represented by dotted line 75 in FIG. 2A, rather than the solid line 44.

Consider next the reception of the received video signal as it has been processed at the transmitter. Specifically, such signal has high gain associated with portions thereof which originally had low amplitudes or low frequency content and has low gain associated with other portions thereof which originally had high amplitude or a skewing of the frequency content to higher values. Such signal is received, in FIG. 5 for example, at antenna 79 and supplied to down-converter 80 whereupon the incoming signal is mixed with a local oscillator 78 to produce an intermediate frequency (IF) signal. Such IF signal is then supplied to FM demodulator 81 which includes a limiter and a discriminator to remove the carrier and supply the video baseband signal to de-emphasis circuit 82. The video signal outputted from de-emphasis circuit 82 still retains the characteristics of high gain for originally low energy levels and low gain for originally high energy levels that were impressed upon the signal at the transmitter. These characteristics must be correct to obtain the originally generated video.

Figure 5:
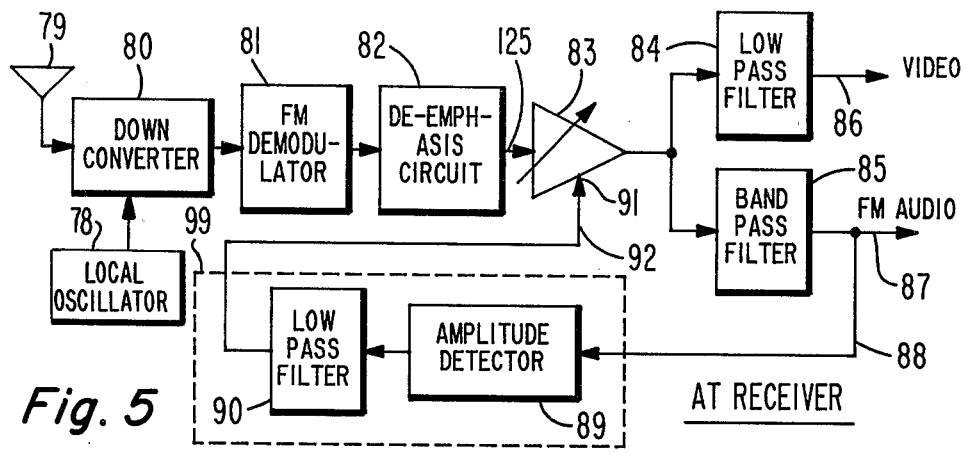
FIG. 5 is a block diagram of a part of the receiver for reconstructing the received signal back to its original form.

It is a function of the receiver to reverse the effects of these gains and, in effect, pass the signal through an AGC circuit which in FIG. 5 is contained in data block 99, that has gain characteristics complementary to the gain characteristics of the transmitter amplifier 22 (FIG. 2). In other words, the gain at the receiver should increase or decrease during portions of the signal in which the gain at the transmitter decreased or increased, respectively. FIG. 5 shows one means for accomplishing such complementary gain of the received signal.

It is often the case that a baseband video system has a sub-carrier at a frequency higher than 4.2 MHz. This sub-carrier is FM modulated with the audio information and would have a constant amplitude except for the effect of the AGC at the transmitter. Thus, it is only necessary that the AGC circuit 99 of FIG. 5 detect the variations in the amplitude of such sub-carrier and generate a control signal for controlling the gain of amplifier 83 so that the sub-carrier retains a constant amplitude and thus, in effect, provides compensation for the variations in gain imposed at the transmitter.

Specifically, in FIG. 5, the output of variable amplifier 83 is supplied to bandpass filter 85 which outputs the modulated audio carrier on output lead 87. Such output signal is also supplied to amplitude detector 89 and then to low pass filter 90, the output of which varies with the amplitude of the sub-carrier. Such control signal is supplied to control input 91 of variable gain amplifier 83 to change the gain thereof so that the amplitude of the sub-carrier supplied from bandpass filter 85 becomes and remains constant. At this point, the gain introduced into the signal at the transmitter has been effectively complemented.

Figure 6:
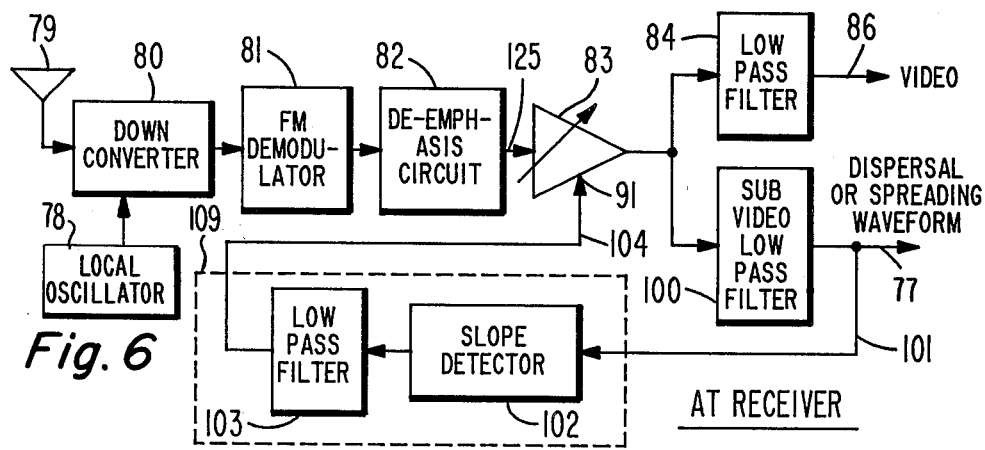
FIG. 6 is a block diagram showing another means for converting the received signal back to its original form.

FIG. 6 shows an implementation for restoring the video signal at the receiver when no constant amplitude FM audio carrier is present. In FIG. 6 a frequency spreading waveform is employed in the transmitted signal. Although not discussed in connection with the transmitter of FIG. 2 is a quite common in FM/TV satellite systems to add a low frequency triangular waveform to the video signal before transmission. This low frequency triangular waveform disperses the carrier energy and is called either the spreading waveform or the dispersal waveform. To effect proper reconstruction of the received video signal such spreading waveform must be detected, after reception and proper AGC operation, as a signal of constant slope, either positive or negative.

In FIG. 6, after the video signal passes through the AGC amplifier 83, it is split into a video component appearing on output lead 86 of low pass video filter 84 and into a sub-video or triangular waveform component appearing on output 77 of sub-video low pass filter 100, thus retrieving the low frequency spreading waveform. The low pass filter 100 for the sub-video portion can be a few hundred Hz wide which is a sufficiently wide bandwidth to retrieve the spreading waveform but none of the video information. The slope of the spreading waveform is detected and compared in slope detector 102. Inequalities between the slope of the received triangular waveform stored reference triangular waveform in slope detector 102 are passed into low pass filter 103 whose output is employed to control the gain of AGC amplifier 83 so that the corrected AGC output produces a clean triangular waveform at output 77 of low pass filter 100.

Figure 7:
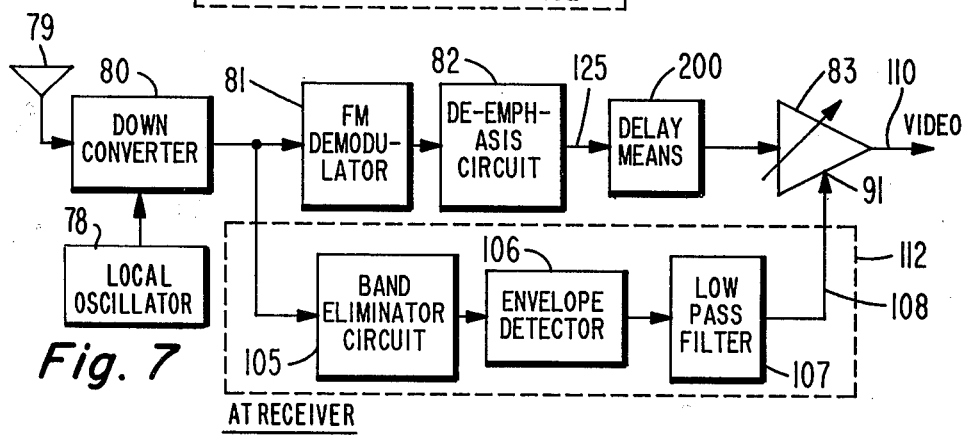
FIG. 7 is yet another block diagram which can be employed at the receiver for reconverting the received companded signal back to its original form.

FIG. 7 shows another implementation for reconstructing the received video signal when neither of the techniques shown in FIG. 5 or 6 is applicable. In FIG. 7 the received and down-converted FM/TV signal at intermediate carrier frequency is passed through both the control circuit 112 and a signal path comprised of FM demodulator 81, de-emphasizing circuit 82, and delay means 200. The band eliminator circuit 105 in control circuit 112 is similar to the band eliminating circuit of FIG. 2 and eliminates the transmission path in-band intermediate carrier frequencies leaving only the out-of-band energy as shown by curve 111 of FIG. 7A; and in the manner discussed in connection with the band eliminating filter 31 of FIG. 2 and the filter characteristic curve 44 of FIG. 2A. Such resulting out-of-band energy outputted from band eliminating circuit 105 of FIG. 7 corresponds to curve 50 of FIG. 3. Envelope detector 106 and low pass filter 107 process the output signal from band eliminator circuit 105 in the same manner as do envelope detector 32 and low pass filter 33 of FIG. 2.

Figure 7A:
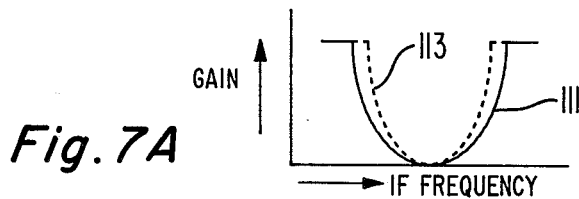
FIG. 7a shows curves of the bandpass characteristics of a filter employed in the structure of FIG. 7.

In some applications, as discussed re FIGS. 2 and 2A, it might be desirable to employ a band eliminating filter that will produce a slightly narrower bandwidth than the transmission path bandwidth to anticipate energy values before they actually produce distortion. The dashed line curve 113 of FIG. 7A represents such a condition and corresponds generally to the dashed line curve 75 of FIG. 2A.

As will be recalled, the gain curve 60 of FIG. 4 is a function of the out-of-band spectral energy when AGC is employed in the system. Both the transmitter gain curve 60 of FIG. 4 and the out-of-band energy with AGC curve 61–63 of FIG. 4 are redrawn in FIG. 8. After filtering by low pass filter 107 the AGC amplifier 83 of FIG. 7 is controlled so that its gain is represented by the dotted line curve 121 of FIG. 8. The two gains curves 60 and 60–121 have values such that the product thereof is substantially unity, thus reconstructing at the receiver the originally generated video signal. By introducing at the receiver the gain characteristic shown by curve 60–121, the gain variation introduced at the transmitter AGC is corrected.

Figure 8:
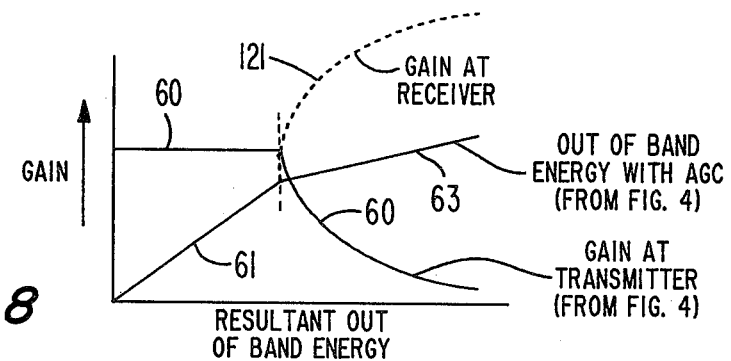
FIG. 8 is a set of curves illustrating how the gain control at the receiver complements the gain at the transmitter, resulting in a reconstructed signal.

The gain curve 121 of FIG. 8 is determined as follows. The curve 61–63 of FIG. 8 substantially represents the actual out-of-band energy with AGC transmitted from the transmitter and received at the receiver as an output signal from low pass filter 107.

Variable gain amplifiers such as amplifiers 22 of FIG. 2 and 82 of FIG. 7 contain control circuits which can respond differently to the same input signals to provide different variable gain characteristics. In the present invention, the variable gain amplifier 83 of FIG. 7 is designed to respond to the input signal represented by curve 61–63 of FIG. 8 to produce a gain function represented by the curve 60–121 of FIG. 8 whereas the variable gain amplifier 22 of FIG. 2 is designed to respond to the input signal represented by curve 61–63 of FIG. 4 to produce the gain function represented by curve 60 of FIG. 4. As stated above, the two gain curves 60–121 and 60 of FIG. 8 are complementary.

While specific logic such as FM modulator 30, filter 31, detector 32 and filter 33 are shown within the dashed line 35 of FIG. 2, it is to be understood that many different types of logic and schemes can be employed which are responsive to the output of pre-emphasis circuit 21 for producing a control signal whose amplitude reflects the change in energy content of that portion of said preemphasized output signal lying outside the allowable transmission path bandwidth and with the variable gain amplifier 22 being responsive to such control signal to vary its gain substantially inversely as said energy content varies. Thus, the out-of-band energy content can be maintained at a nearly constant rate or at a rate which varies in accordance with some predetermined function as the out-of-band energy content varies.

Figure 9:
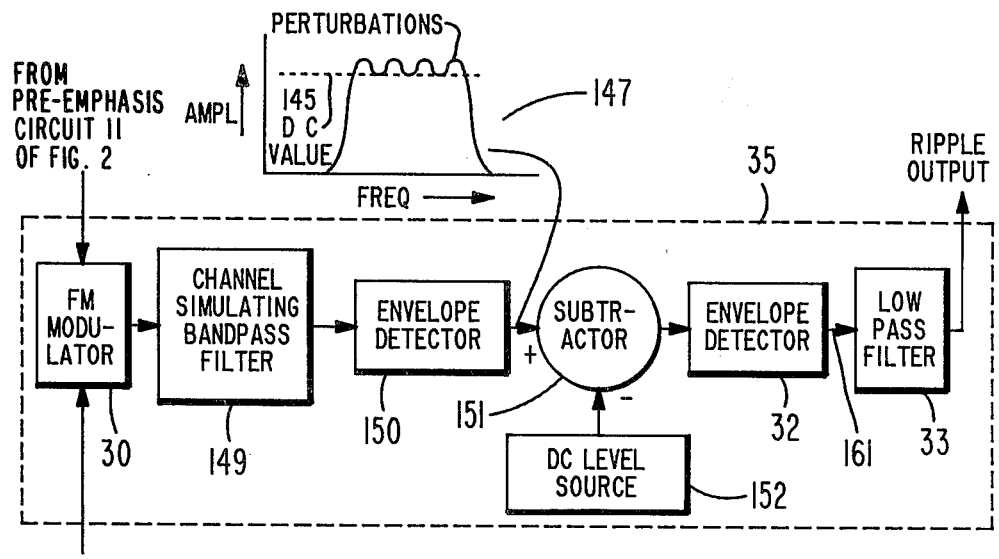
FIG. 9 shows an alternative form of the invention.

One such other means for performing the AGC function currently performed by the logic shown within the dotted line 35 of FIG. 2 is shown in FIG. 9. The alternative transmitter embodiment of FIG. 9 works on the principle that if out-of-band energy is low the amplitude of the envelope of the FM modulated carrier is relatively constant. On the other hand, if there is a substantial amount of out-of-band energy, the envelope will experience fluctuations; the larger the out-of-band energy the larger the fluctuations. The bandpass filter 149 following the FM modulator 30 in FIG. 9 simulates the overall filtering in the channel. The output of the following envelope detector 150 consists of a constant amplitude 145 plus fluctuations, as shown in curve 147, which is supplied to the plus input of subtractor 151. By a presetting procedure, the d.c. voltage from source 152 is made to be substantially equal to the d.c. component supplied from detector 150 in the absence of a TV signal. Such preset d.c. voltage from subtractor 151 is supplied to the minus input of subtractor 151 thus cancelling out the constant amplitude from envelope detector 150 at the output of subtractor 151. When a TV signal is supplied to FM modulator 30, the resulting signal on output lead 161 of envelope detector consists of fluctuations only. Such fluctuations are supplied to the low pass filter (LPF) 33. The output of LPF 33 controls the AGC amplifier 22 of FIG. 2.

Figure 10:
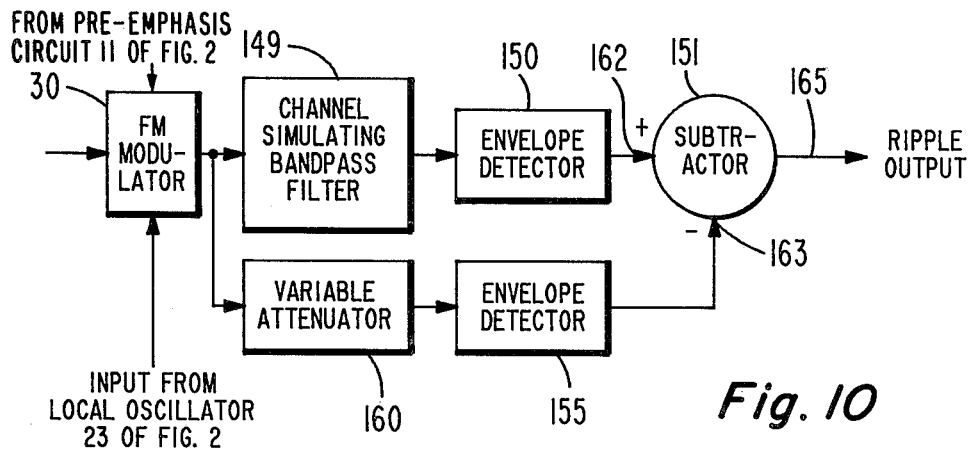
FIG. 10 shows yet another alternative form of the invention.

In FIG. 10 there is shown a variation of the circuit of FIG. 9 which can be employed in the system. As in FIG. 9, filter 194 simulates the overall filtering characteristics of the channel. The output of envelope detector 150 consists of a constant amplitude (d.c.) signal plus fluctuations, i.e., a ripple caused by out-of-band energy. Further, the filter 149 introduces some attenuation. It is desired that the d.c. value supplied to subtract input 163 of subtractor 151 be equal to the d.c. value supplied to the add input 162 of subtractor 151. The foregoing is accomplished by variable attenuator 160 and envelope detector 155. The TV input signal is first set to zero so that only the d.c. component will be supplied from detector 150 to subtractor 151. Then the variable attenuator 160 is set to compensate for the attenuation in filter 149 so that the d.c. output of detector 155 is equal to the d.c. output of detector 150 and the signal on output lead 165 of subtractor 151 is zero. Thus, when the TV signal is supplied to the circuit only the ripple caused by the out-of-band energy will appear on output lead 165 of subtractor 151. The two envelope detectors 150 and 155 are matched so that their effect on the signals supplied thereto are the same.

In cases where the output level of the FM modulator 30 might change over time the structure of FIG. 10 can be advantageously employed.

What is claimed is:

1. In a frequency modulated television (FM/TV) system, a transmitter for transmitting an FM/TV signal over a transmission path having a certain frequency bandwidth and comprising means at the transmitter for generating an FM/TV signal, a variable gain amplifier responsive to said FM/TV signal to produce an amplifier video signal, and means for up-converting said amplified FM/TV signal for transmission thereof, an improved automatic gain control system comprising:
means responsive to said FM/TV signal for producing a first control signal whose amplitude reflects the particular energy content of that portion of said up-converted FM/TV signal lying outside a given percentage of said certain frequency bandwidth; and
said variable gain amplifier responsive to said first control signal to vary its gain substantially inversely as said particular energy content varies.

2. A system as in claim 1 and further comprising:
a receiver;
detecting means at said receiver for detecting the variation in gain applied to said FM/TV signal at said transmitter to produce a second control signal which reflects said variation in gain at said transmitter; and
a second variable gain amplifier at said receiver responsive to said second control signal to provide gain to said received FM/TV signal which is complementary to said gain applied to said FM/TV signal at said transmitter.

3. A system as in claim 2 and further comprising:
means at said transmitter for generating a constant amplitude signal, in the absence of gain at said transmitter, as a component of said FM/TV signal; and
in which said detecting means is responsive to those amplitude variations in said originally generated constant amplitude signal which were produced by said variable gain amplifier at said transmitter to produce said second control signal.

4. A system as in claim 2 and further comprising:
generating means at said transmitter for modulating said FM/TV signal with a frequency spreading triangularly-shaped waveform of a known low frequency and known slope; and
in which said detecting means comprises slope detecting means containing a reference slope for detecting and comparing the slope of the received triangularly-shaped waveform with said reference slope to produce said second control signal.

5. A system as in claim 2 in which said detecting means comprises:
band eliminating means responsive to said received FM/TV signal to determine that portion thereof lying outside said transmission bandwidth; and
means responsive to said portion lying outside said transmission bandwidth to produce said second control signal.

6. In a frequency modulated television (FM/TV) transmitting system, a transmitter for transmitting an FM/TV signal over a transmission path having a certain frequency bandwidth and means at the transmitter for generating a pre-emphasized, FM/TV signal, a variable gain amplifier responsive to said pre-emphasized FM/TV signal to produce an amplified FM/TV signal, and a frequency modulator (FM) circuit for modulating a carrier signal with the amplified FM/TV signal output of said variable gain amplifier, an improved automatic gain control system comprising:
means responsive to said pre-emphasized FM/TV signal for producing a first control signal whose amplitude reflects the energy content of a predetermined percentage of that portion of said pre-emphasized FM/TV signal lying outside said transmission bandwidth;
said variable gain amplifier responsive to said first control signal to vary its gain substantially inversely as said energy content varies;
a receiver;
detecting means at said receiver for detecting the variation in gain applied to said FM/TV signal at said transmitter to produce a second control signal which reflects said variation in gain at said transmitter; and
a second variable gain amplifier at said receiver responsive to said second control signal to provide gain to said received FM/TV signal which is complementary to said gain applied to said FM/TV signal at said transmitter.

7. A system as in claim 6 and further comprising:
means at said transmitter for generating a constant amplitude signal as a component of said FM/TV signal; and in which said detecting means is responsive to those amplitude variations in said originally generated constant amplitude signal which were produced by said variable gain amplifier at said transmitter to produce said second control signal.

8. In a frequency modulated television FM/TV transmission system comprising a transmitter for transmitting an FM/TV signal over a transmission path having a certain bandwidth, means at the transmitter for generating a pre-emphasized baseband TV signal, and a variable gain amplifier responsive to said pre-emphasized baseband TV signal to produce an amplified baseband TV signal, an improved automatic gain control system for FM/TV transmission comprising:
- a frequency modulator (FM) circuit responsive to said pre-emphasized baseband TV signal to generate a frequency spectrum a first part of which lies within the bandwidth of the transmission path and a second part of which lies outside said bandwidth;
- a band eliminating filter responsive to the output of said FM circuit to filter out the first portion of the output of said FM circuit; and
- means responsive to the output of said band eliminating filter to produce a control signal which is proportional to the energy content of said first portion of the output of said band eliminating filter; and
- said variable gain amplifier responsive to said control signal to increase its gain inversely, in a predetermined relationship, as said gain correcting signal varies.

9. In a television (TV) transmission system comprising a transmitter for transmitting a TV signal to a receiver over a transmission path having a certain bandwidth and in which said transmitter comprises means for generating a baseband TV signal, a pre-emphasis circuit responsive to said baseband TV signal to produce a pre-emphasized output signal, and means including a variable gain amplifier responsive to said pre-emphasized output signal to produce an amplified baseband video signal, a method of automatically controlling the gain of said system comprising the steps of:
- determining the energy content of that portion of said pre-emphasized output signal which lies outside a given percentage of the transmission path bandwidth;
- varying the gain of said variable gain amplifier in a predetermined inverse relationship to said energy content; and
- amplifying the received TV signal at said receiver in a predetermined inverse relationship to the variation of the gain of said variable gain amplifier.

10. In a frequency modulated television (FM/TV) transmission system comprising a transmitter for transmitting an FM/TV signal to a receiver over a transmission path having a certain bandwidth and with said transmitter comprising means for generating a TV signal, means including a variable gain amplifier responsive to said TV signal for producing an amplified FM/TV signal and means for up-converting said amplified FM/TV signal for transmission thereof, a method of automatically controlling the gain of said system comprising the steps of:
- determining the energy content of that portion of said FM/TV signal which lies outside a given percentage of the transmission path bandwidth;
- varying the gain of said variable gain amplifier in a predetermined inverse relationship to said energy content; and
- amplifying the received FM/TV signal at said receiver in a predetermined inverse relationship to the variation of the gain of said variable gain amplifier at said transmitter.

* * * * *

UNITED STATES PATENT AND TRADEMARK OFFICE
CERTIFICATE OF CORRECTION

PATENT NO. : 4,403,255

DATED : September 6, 1983

INVENTOR(S) : Leonard Norman Schiff

It is certified that error appears in the above-identified patent and that said Letters Patent is hereby corrected as shown below:

Column 7, line 20, "is a" should be --it is--.

Column 9, line 19, "194" should be --149--.

Signed and Sealed this

Fifteenth Day of November 1983

[SEAL]

Attest:

GERALD J. MOSSINGHOFF

Attesting Officer     Commissioner of Patents and Trademarks